United States Patent [19]

Shiraiwa et al.

[11] Patent Number: 5,224,999
[45] Date of Patent: Jul. 6, 1993

[54] HEAT TREATMENT APPARATUS

[75] Inventors: Hirotsugu Shiraiwa, Hino; Satoshi Kagatsume, Nirasaki; Takashi Tozawa, Kofu, all of Japan

[73] Assignee: Tokyo Electron Kabushiki Kaisha, Tokyo, Japan

[21] Appl. No.: 910,580

[22] Filed: Jul. 8, 1992

[30] Foreign Application Priority Data

Jul. 11, 1991 [JP] Japan .................. 3-198937

[51] Int. Cl.$^5$ .............................. C23C 16/00
[52] U.S. Cl. .................. 118/724; 118/715; 118/725; 118/728; 118/733; 219/390; 156/345
[58] Field of Search .......... 118/715, 724, 725, 728, 118/733; 156/345; 219/390

[56] References Cited

U.S. PATENT DOCUMENTS

| | | | |
|---|---|---|---|
| 4,640,223 | 2/1987 | Dozier | 118/725 |
| 4,998,540 | 2/1991 | Fuse | 118/725 |
| 5,121,705 | 6/1992 | Sugino | 118/725 |

FOREIGN PATENT DOCUMENTS

1-24926  1/1989  Japan .

*Primary Examiner*—Richard Bueker
*Attorney, Agent, or Firm*—Beveridge, DeGrandi, Weilacher & Young

[57] ABSTRACT

A vertical type of heat treatment apparatus which houses objects for treatment loaded on a wafer boat, in a process tube and performs heat treatment, and including a cap which opens and closes an opening portion of a manifold and which is disposed on the side of an opening portion of the process tube, a support mechanism which elastically supports the cap and which is provided to a vertical motion mechanism of the wafer boat, and an expandable and contractible airtightness maintenance means which maintains airtightness on the side of the cap, and which is provided between the cap and the vertical motion mechanism.

6 Claims, 7 Drawing Sheets

HEAT TREATMENT APPARATUS

BACKGROUND OF THE INVENTION

The present invention relates to heat treatment apparatus used in heating processing and the like for semiconductor wafers and other objects to be treated.

FIG. 6 shows one portion of a generally used type of heat treatment apparatus used in the manufacture of semiconductors, for CVD processing and for oxidation by heat treatment of semiconductors. This heat treatment apparatus is provided with a process tube 4 which is the processing chamber which implements a required processing such as heating or the like to wafers 2 which are the object to be processed. To the lower side of this process tube 4 is provided a load lock chamber 8 via a manifold 6 which is configured from stainless steel or the like. The manifold 6 is a cavity portion for connecting the process tube 4 and the load lock chamber 8, and the load lock chamber 8 is a blocking chamber for blocking the outside air from the wafers 2 either prior to or after treatment thereof by the process tube 4.

The process tube 4 is formed of a heat-resistant material such as silica glass or the like which does not exert an influence with respect to the objects being processed, and is a cylindrical shape with one end closed, and is disposed immediately above the upper portion of the load lock chamber 8. In this manner, the treating furnace with the process tube 4 immediately above it is called a vertical type furnace. Around this process tube 4 is a heater 10 for performing heating or some other necessary process with respect to the wafers 2. This heater 10 performs electrical heating control and so is connected to a heating control apparatus. The treatment temperature of the process tube 4 is set to 500°–1000° C. for the CVD process, or to 800°–1000° C. for oxidation treatment or diffusion treatment.

To the manifold 6 which is disposed to the side of the lower end of this process tube 4 is provided a gas introduction tube 12 for the introduction of a treatment gas $G_1$ corresponding to the treatment, into the process tube 4, and this gas introduction tube 12 is connected via a control valve or the like to a gas source (not shown). For example, SiH4 is used as the treatment gas for CVD treatment when a polysilicon film is to be formed, and NH4, SiH2Cl2 is used as the treatment gas when a silicon nitride film is to be formed, and these gases are introduced into the process tube 4 via the gas introduction tube 12, and $N_2$ gas or the like is introduced into the process tube 4 as the purge gas.

The inside of this process tube 4 is provided with a cylindrical partition wall formed of a heat resistant material such as silica glass or the like. After the treatment gas which has been introduced from the gas introduction tube 12 moves from the side of the manifold 6 and from the bottom to the top of the process tube 4, it moves to the outer side of the partition wall 14 and again returns to the manifold 6. More specifically, the manifold 6 of the outer surface portion of the partition wall 14 is connected to an exhaust pipe 16 which is the exhaust portion for the exhaust of the air in the initial status, or the treatment gas $G_1$ which has been recirculated, and this exhaust pipe 16 is connected to a vacuum apparatus such as a vacuum pump or the like (not shown). The air and the treatment gas $G_1$ which has been introduced are forcedly exhausted from the process tube 4 through the vacuum apparatus.

In addition, the wafers 2 which are the object of treatment are carried into the process tube 4 by a wafer boat 18 from the load lock chamber 8 via the conveyor chamber 8a. In addition, to the opening portion 19 on the side of the load lock chamber 8 of the manifold 6 is provided a shutter 20 as an interrupt means between the load lock chamber 8 and the process tube 4. This shutter 20 swivels along with unloading and closes the opening portion 19 of the manifold 6 when there wafer boat 18 is unloaded from the process tube 4.

Furthermore, the load lock chamber 8 is provided with a boat elevator 22 as the raising and lowering mechanism for raising and lowering the wafer boat 18 and for loading and unloading the wafers 2 to and from the process tube 4. To the upper surface of this boat elevator 22 is provided a heat retention cylinder 24 for supporting the wafer boat 18 and forming a region of uniform temperature. When the wafer boat 18 is unloaded, this heat retention cylinder 24 seals the open surface of the manifold 6 and so forms a cap 26, while the arm portion 22a of the boat elevator 22 has a flat plate 26a comprised of stainless steel, and between this flat plate 26a and the cap 26 is a coil spring 26b arranged at three places for example. More specifically, when the objects for treatment are being loaded into the process tube 4, the shutter 20 swivels and opens, the boat elevator 22 rises, and the manifold 6 is sealed by the cap 26 of the heat retention cylinder 24 and the process tube 4 is blocked off from the load lock chamber 8.

In addition, the wall surface portion of this load lock chamber 8 is provided with a gate 28 through which is performed the carrying in of the wafers 2 from the conveyor chamber 8a prior to treatment and the carrying out of the wafers 2 from the load lock chamber 8 after treatment, and this gate 28 is provided with a gate valve for blocking the load lock chamber 8 and the conveyor chamber 8a. The wall surface portion of the load lock chamber 8 is provided with a gas introduction pipe 30 and an exhaust pipe 32, and the gas introduction pipe 30 is connected to a gas source for an inert gas which is the purge gas $G_2$ or the like. More specifically, the purge gas $G_2$ is supplied from the gas introduction pipe 30 to inside the load lock chamber 8, and a vacuum is made inside the load lock chamber 8 via the exhaust pipe 32, and either the creation of a vacuum or the exhaust of the supplied gas $G_2$ are performed via the gas introduction pipe 30.

In such a conventional heat treatment apparatus, the boat elevator 22 is provided as the means for opening and closing the opening portion 19 of the manifold 6, and for the carrying in and out of the process tube 4, of the wafers 2 which are the object of treatment. Then, this boat elevator 22 is provided with a drive mechanism 34 which is configured by a ball screw or the like, for performing up and down motion. This boat elevator 22 has the wafer boat 18 and several tens of wafers 2 placed on it, and is supported by the cap 26 which seals the opening portion 19 of the manifold 6 but when the opening portion 19 of the manifold 6 is sealed, it is necessary for this cap 26 to be in gentle contact with the opening portion 19 of the manifold 6. There are cases when the manifold 6 is formed of stainless steel but when it is formed of silica glass or the like, there is the danger of it breaking should an impact be applied to the side of the manifold when the opening portion 19 is sealed. Furthermore, when there is such an impact force, the wafers 2 on the wafer boat 18 are moved and this generates particles which adhere to the wafers 2 and cause an adverse influence with respect to the film formation treatment. In addition, from the necessity of maintaining airtightness on the side of the manifold 6, it is necessary that the cap 26 and the opening portion 19 of the manifold 6 be sealed with a constant degree of adhesion.

In addition, even if the degree of verticality of the process tube 4 and the manifold 6 is set with a high precision, it is difficult to establish a degree of verticality for the wafer boat 18 which is mounted on the heat retention cylinder 24, and a degree of horizontality for the wafer boat 18. Furthermore, in the status where both the horizontality of the cap 26 and the verticality of the wafer boat 18 are not both established, closing the cap 26 to the manifold 6 means that the wafer boat 18 will be housed in the process tube 4 in an inclined status when the cap 26 is closed to the manifold 6. If film formation treatment is implemented to the wafers 2 when there is a status such as this, then there will be an eccentric recirculation density of the treatment gas with respect to the wafers 2 of the wafer boat 18 and there will be a loss of thermal uniformity because of the changes in the distance to the heater 10. This will result in non-uniform treatment with respect to the wafers 2, and there will be a higher incidence of faults.

Not only this, as shown in FIG. 7, a conventional horizontal type furnace has a lower end base portion of a diagonally moving member 170 pivoted by a horizontal shaft 180 to the moving unit 120 and this diagonally moving member 170 is provided horizontal to a cylindrical unit 190 which has one closed end. Moreover, a base portion of a cantilever 800 is supported to the inner surface of this cylindrical unit 190 by support members 200a, 200b and by a spring 210. Then, the outer periphery of the cylindrical unit 190 engages with a furnace opening door 700, and is supported by a spring 220, and a bellows 140 links the diagonally moving member 170 and the furnace opening door 700. A spring 130 which presses the door 700 to the furnace opening is inserted between the diagonally moving member 170 and the furnace opening door 700 (for example, see Utility Model Publication No. 24926-1989).

However, this type can only be applied to horizontal type furnaces and cannot be applied to vertical furnaces, and in addition, there is no heat retention for the wafer boat, there are no rotating portions, and there is also no implementation of heat insulation.

SUMMARY OF THE INVENTION

With respect to this, the present invention has as an object the provision of a heat treatment apparatus which has an increased degree of contact between the cap of the heat retention cylinder and the opening portion when there is sealing of the opening portion of the manifold, and which prevents the objects for treatment from being housed in the process tube in an inclined status when there is loading of the objects for treatment.

The heat treatment apparatus of the present invention is a vertical type of heat treatment apparatus which houses objects for treatment in a process tube and performs heat treatment, and is provided with a cap for a heat retention cylinder and which opens and closes a manifold which is disposed on the side of an opening portion of a process tube, a support mechanism which elastically supports a cap and which is provided to a vertical motion mechanism of a wafer boat, and an expandable and contractible airtightness maintenance means which maintains airtightness on the side of the cap, and which is provided between the cap and the vertical motion mechanism.

In addition, the heat treatment apparatus of the present invention has support positions set for a plural number of positions of the cap and which are separated by a required angle, and support mechanisms having springs built into these support positions along their axes are provided.

In the heat treatment apparatus of the present invention, the cap which opens and closes the manifold is elastically supported by the support mechanism and so this support mechanism brings the cap into gentle contact with the manifold and the elastic supporting of the cap ensures close sealing between the cap and the manifold. An airtightness maintenance means which can expand and contract is disposed between the support mechanisms and so acts along with the elastic support of the cap with respect to the support mechanism to maintain airtightness between the cap and the manifold.

The cap is elastically supported by the support mechanism and so when the cap is in close contact with the manifold, the elasticity absorbs inclination on the side of the cap. As a result, the object of treatment and which is on the cap, has a degree of verticality maintained using the opening portion of the manifold, that is, the opening portion of the process tube as a reference. As a result, the cap has self-alignment performed using the opening portion of the process tube as a reference, and is brought into contact with the manifold, it is possible for the center axis of the object of treatment and the center axis of the process tube to agree, and for the opening portion of the manifold to be closed and sealed by the cap. As a result of this, it is possible to prevent non-uniformity of treatment caused by the inclination of the object of treatment. In addition, it is also possible to compensate for lowering of the degree of accuracy on the side of the raising and lowering mechanism, for the required degree of accuracy on the side of the raising and lowering mechanism to be reduced, and therefore allow greater freedom of design.

Also, the supports for the cap with respect to the support mechanism are set with support positions at a plural number of places which are displaced by a required angle on the cap, and support is provided by springs inserted at these support positions. because of this, there is no displacement between the opening portion of the manifold and the support mechanisms, and a stable and elastic support status is provided. Because of this stable support status, it is possible to have elastic contact of the cap with respect to the manifold. Even assuming that the support mechanism has been suddenly moved and the cap is moved towards the manifold, the springs between the manifold and the cap absorb the impact force which is generated between the two. The contact pressure of the springs operates via the support mechanism and from the cap to the manifold, and contributes to maintaining a status of close contact between the cap and the manifold.

DETAILED DESCRIPTION OF THE PREFERRED EMBODIMENTS

Figure 1:
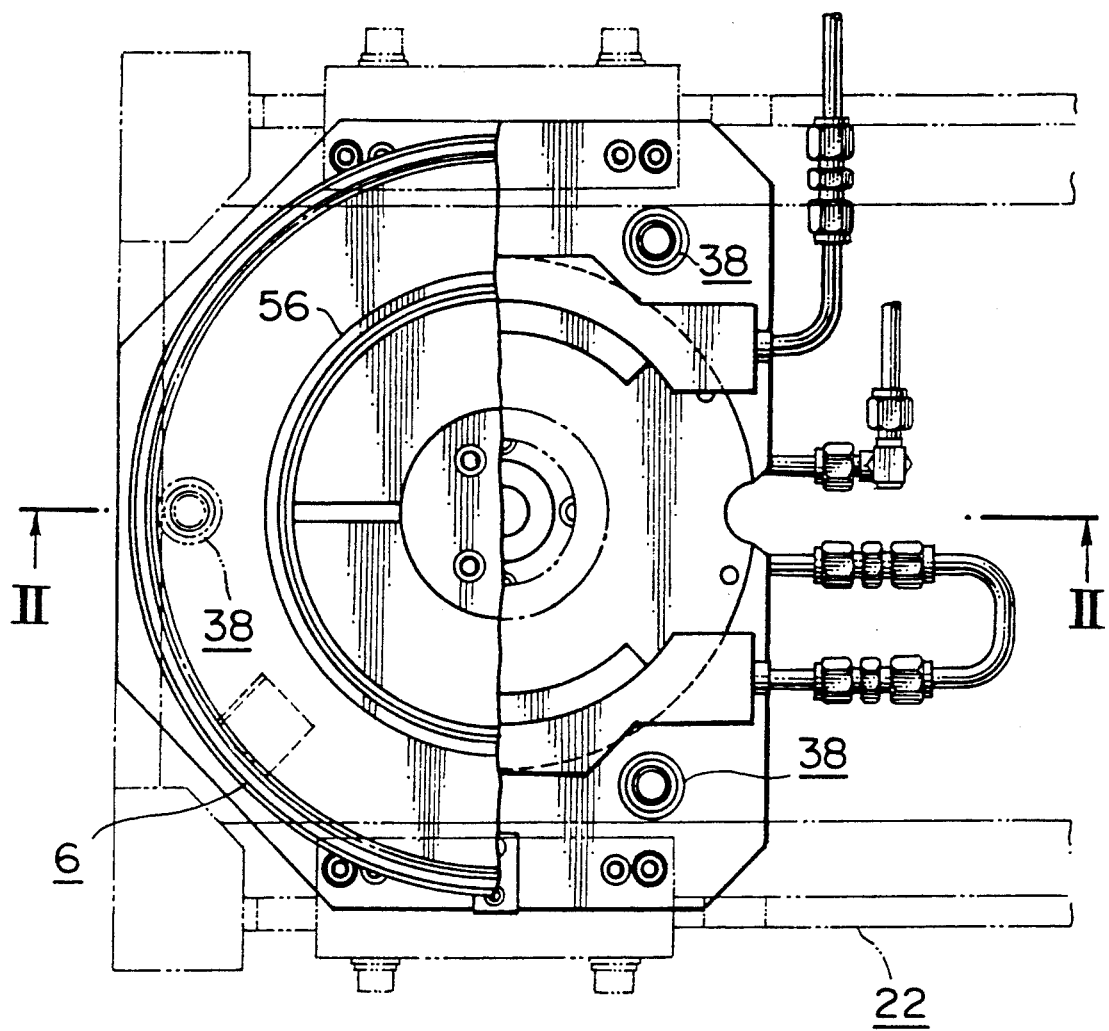
FIG. 1 is a cutout plan view of the left half of a first embodiment of the heat treatment apparatus of the present invention.
Figure 2:
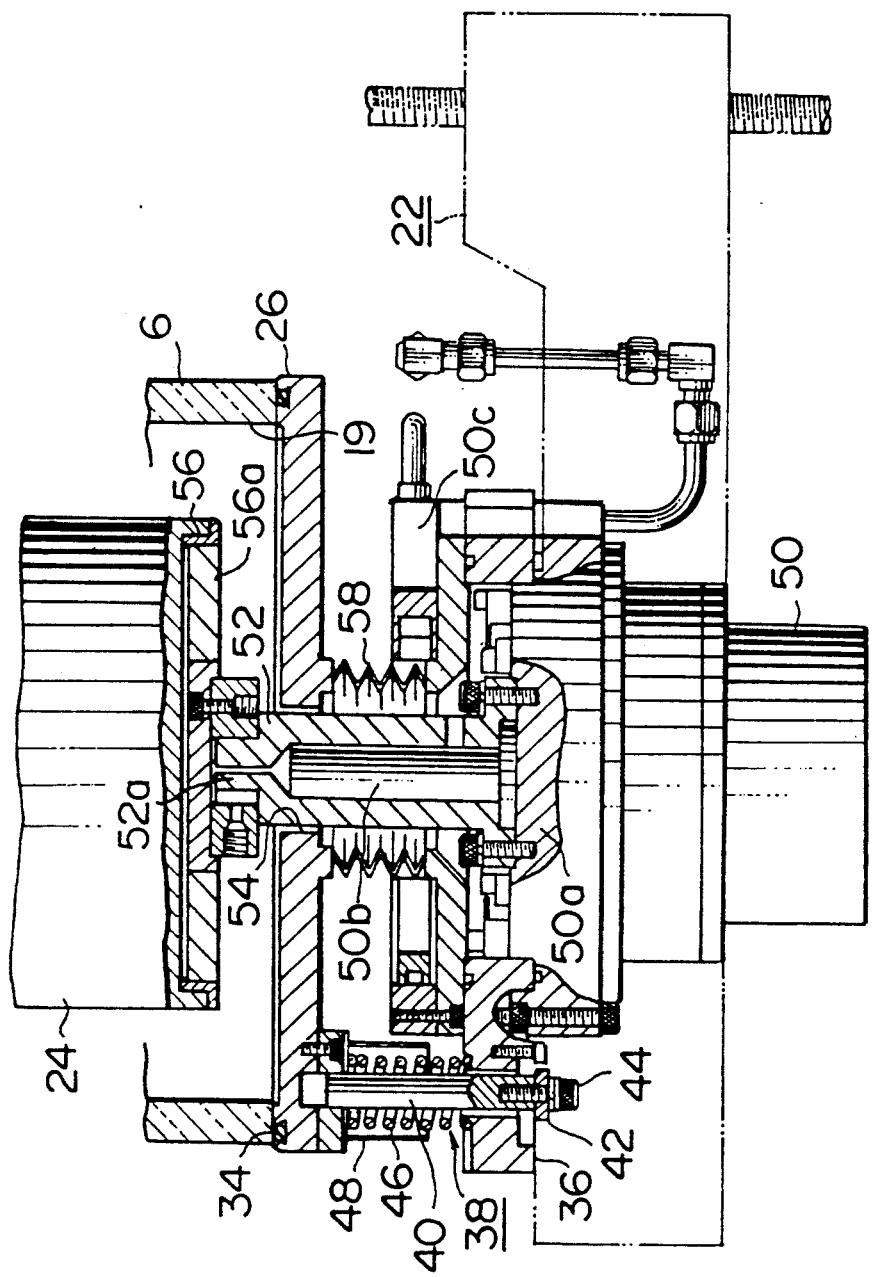
FIG. 2 is a sectional view seen along section line II—II of the heat treatment apparatus shown in FIG. 1, and to which a manifold and a heat retention cylinder have been added.
Figure 6:
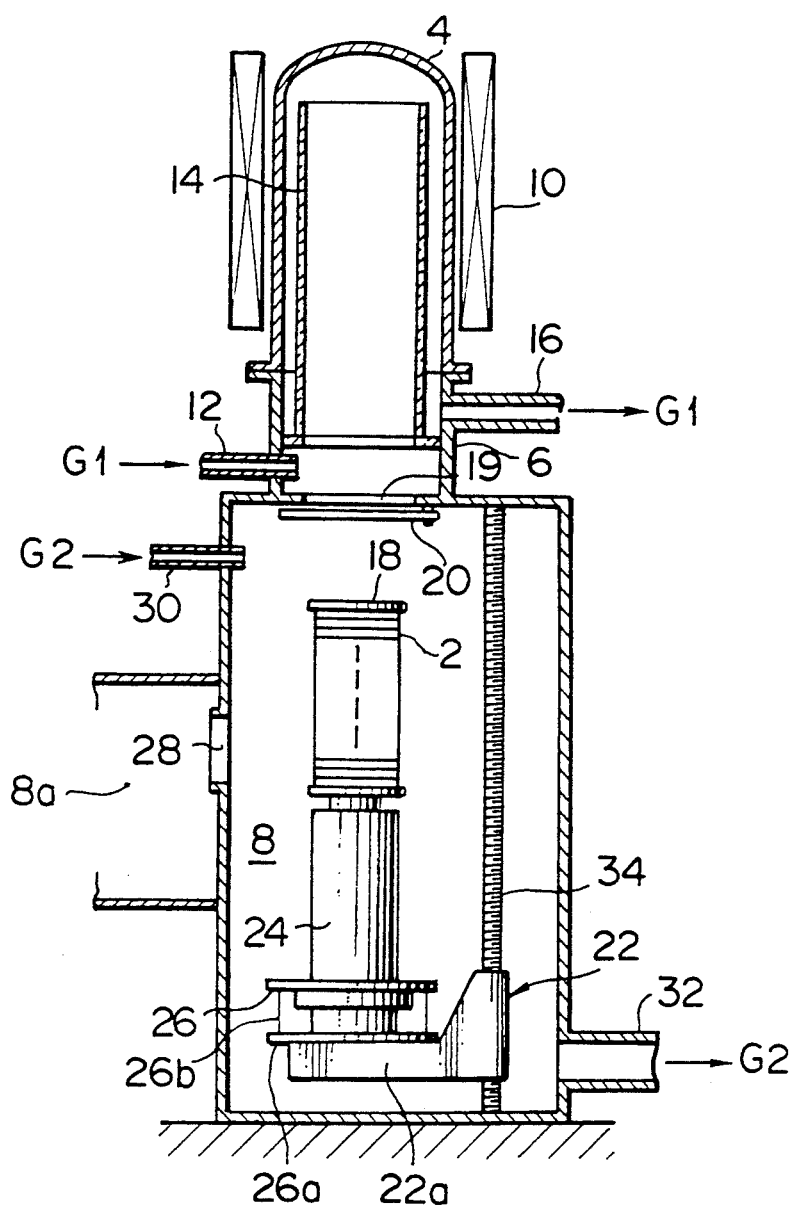
FIG. 6 is a longitudinal sectional view showing a conventional vertical type heat treatment apparatus.
Figure 7:
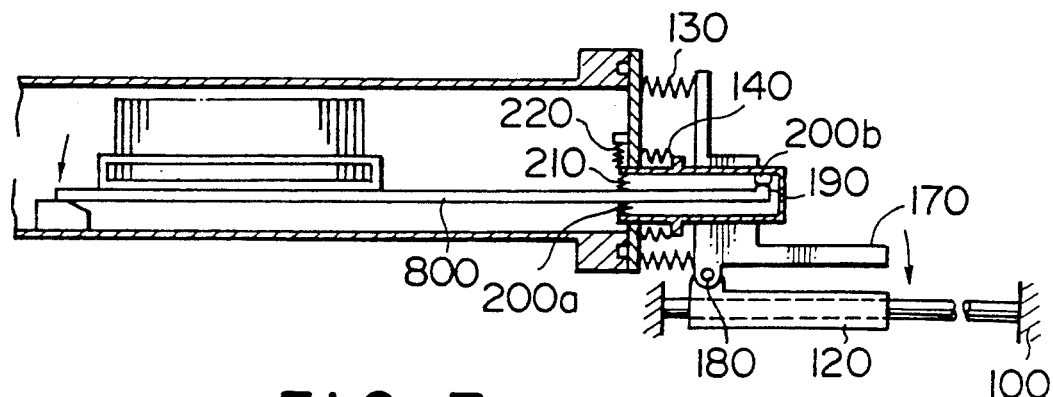
FIG. 7 is a longitudinal sectional view showing the furnace opening portion of a conventional vertical type heat treatment apparatus.

FIG. 1 and FIG. 2 show one embodiment of the heat treatment apparatus of the present invention, with FIG. 2 being a sectional view seen along section line II—II, and those portions which correspond to portions indicated for the conventional vertical type heat treatment apparatus in FIG. 6 are shown using the same numerals. First, as shown in FIG. 2, a manifold 6 comprising stainless steel and which is disposed to the side of the opening portion of the process tube is formed with an opening portion 19 which is circular in shape. A cap 26 of stainless steel and which has the shape of a plate is provided as an opening and closing means for opening and closing this opening portion 19. The cap 26 comprises a plate shaped body which has a surface which can seal in accordance with the shape of the opening portion 19 of the manifold 6, and an O-ring 34 formed from an elastic material such as rubber or the like is provided as an airtightness maintenance means, to a position corresponding to the end surface portion of the opening portion 19.

The cap 26 is elastically supported by a plural number of support mechanisms 38, on a support frame 36 of a boat elevator 22 which is the raising and lowering mechanism. Each of the support mechanisms 38 is provided to a position on the same circle, and are spaced at equal angles around the center of the cap 26. In this embodiment, they are positioned at three places, each separated by an angle of 120°. More specifically, the cap 26 has a support shaft 40 which can moves through a support frame 36, and to the lower end portion of the support shaft 40 which passes through the support frame is a flange portion 42 which acts as a stopper and which is fixed by a bolt 44 so that the range of movement of the cap is set by this flange 42. Between the support frame of the cap 26 is provided a coil spring 46 which is an elastic means. This coil spring 46 is supported by a support shaft 40, and the is protected by a circular protector washer 48 which is mounted to the side of the cap 26.

In addition, to the side of the lower surface of the support frame 36 is mounted a motor 50 which is the means of rotationally driving the wafer boat. The rotating shaft 52 which is connected to the rotating portion 50a and the motor shaft 50b of the motor 50 passes through the hole 54 provided to the center portion of the cap 26, and the distal end portion 52a protrudes to the upper surface of the cap 26. To the distal end portion of the cap 26 is mounted a heat retention cylinder receiver 56 which is a circular plate at a constant interval from the cap 26. This heat retention cylinder receiver 56 is provided with a heat retention cylinder 24 and as shown in FIG. 6, there is a wafer boat 18 provided above this. Accordingly, the heat retention cylinder receiver 56 and the heat retention cylinder 24 are rotated by the motor 50 which is mounted to the support frame 36 so that there is uniform heating of the object for treatment.

The wafer boat 18 and the heat retention cylinder 24 are elastically supported to the boat elevator 22.

In addition, a bellows 58 is provided by welding or some other means, as a expandable and contractible means of maintaining airtightness and so as to surround the rotating shaft 52 between the upper surface portion of the support frame 36 and the lower surface portion of the cap 26. More specifically, the bellows 58 expands and contracts in accordance with the up and down motion of the cap 26 due to the support mechanism 58, and closes the holes irrespective of the up and down motion of the cap 26 and maintains airtightness of the manifold 6. In addition, the welded portion of the bellows 58 is provided with a water-cooled jacket 50c for maintaining the weld portion.

Figure 3A:
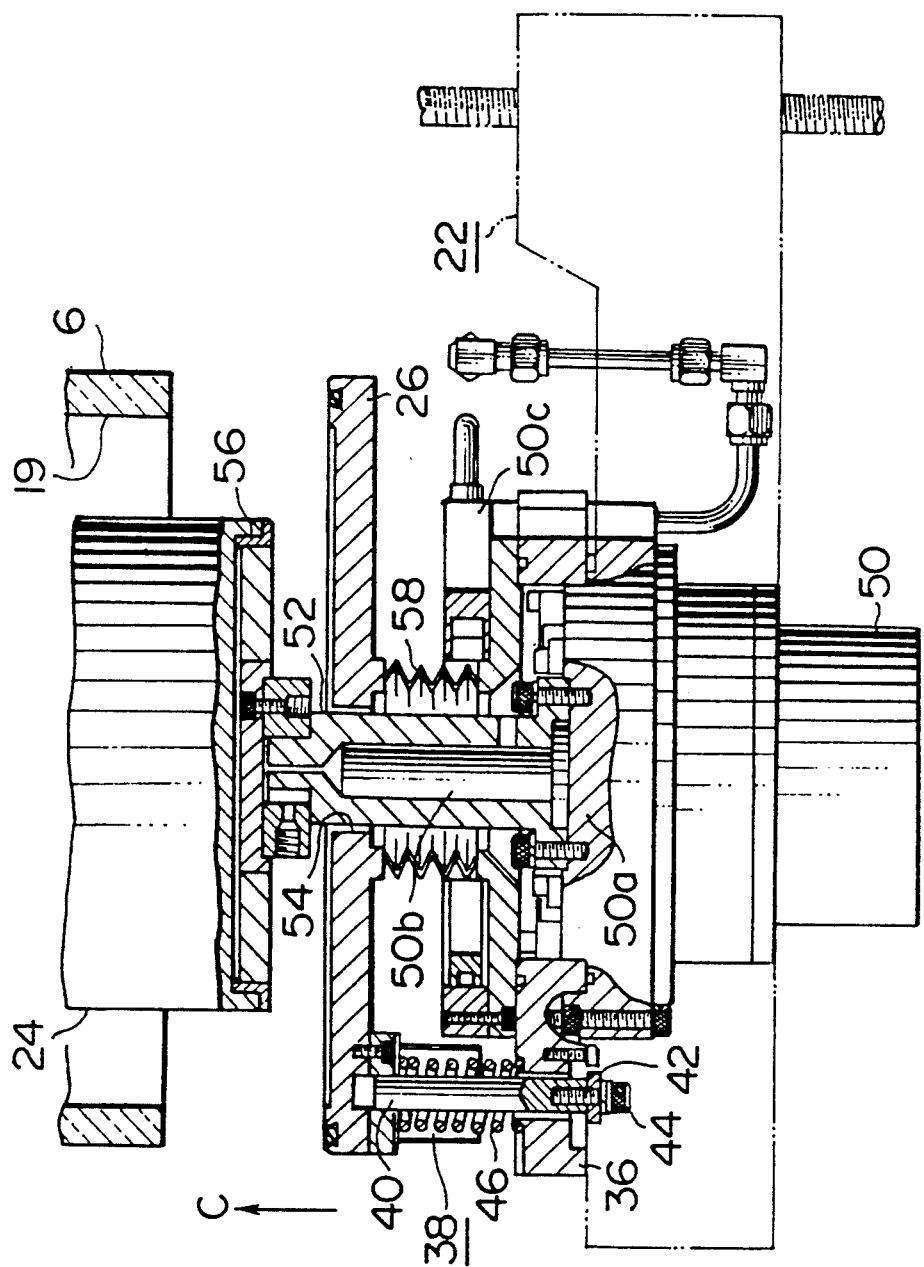
FIG. 3 is a sectional view showing the operation of the heat treatment apparatus shown in FIG. 1, with FIG. 3A being a view when the boat elevator is raised in the direction of the arrow C, FIG. 3B being a view when the boat elevator is raised further, and a view when the cap is in contact with the opening portion of the manifold.

The following is a description of the operation of the configuration described above. As shown in FIG. 3A, when the boat elevator 22 rises in the direction shown by the arrow C, the boat elevator 22 and the cap 26 both rise in the direction of the opening portion 19 of the manifold 6. At this time, the heat retention cylinder 24 raises the inside of the manifold 6 and the wafer boat 18 on top of this is moved to inside the process tube 4.

Figure 3B:
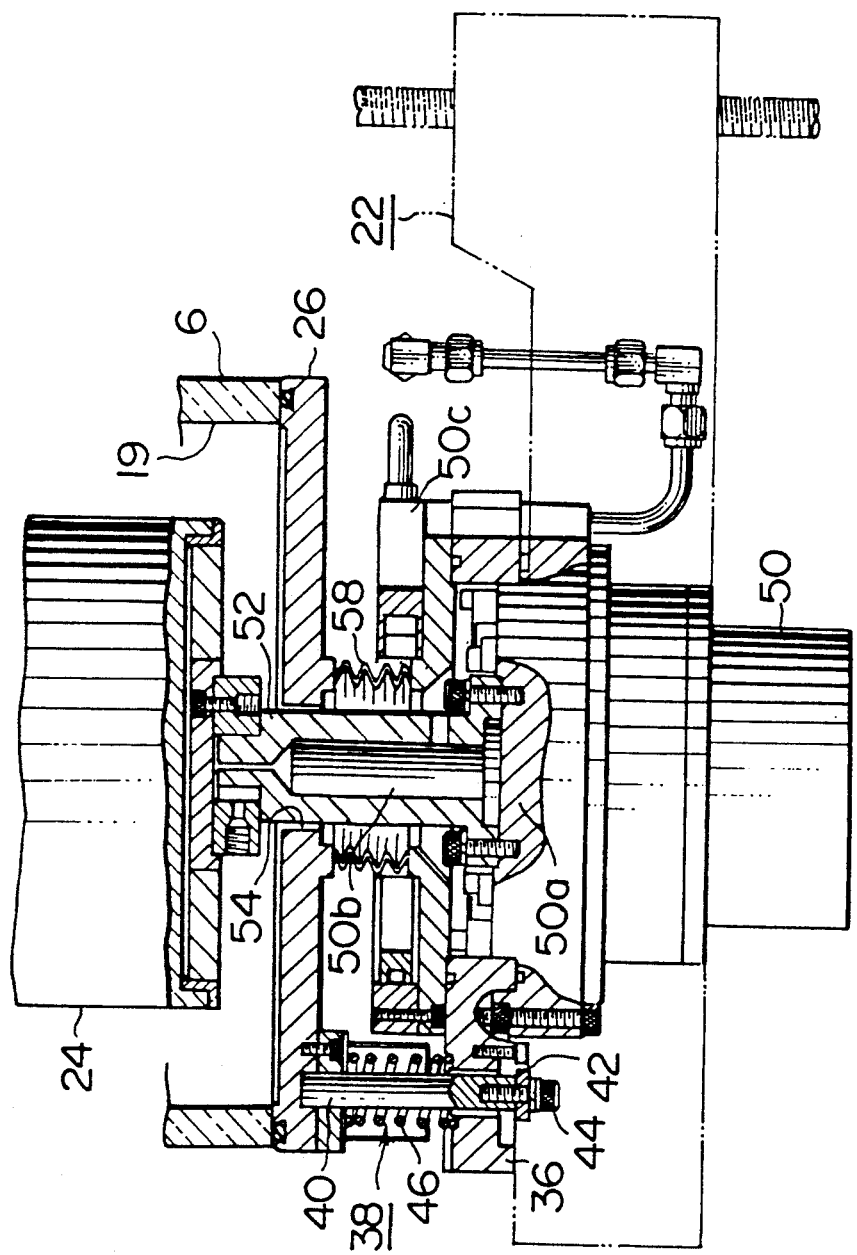

Also, as shown in FIG. 3B, when the boat elevator 22 rises further, the cap 26 comes into contact with the opening portion 19 of the manifold 6 and the pressure force accompanying the rise of the boat elevator 22 acts to the coil spring 48 of the support mechanism 38 and causes it to contract. The contraction of this coil spring 46 absorbs the pressure force due to the boat elevator 22 and the cap 26 is elastically brought into contact with the opening portion 19 of the manifold 6. As a result, the cap 26 is self-aligned using the opening portion 19 as the reference, and a status of stable and close contact is maintained between the cap 26 and the opening portion 19 of the manifold 6. At the same time, the bellows 58 is in the contracted status. This bellows 58 seals the through hole 54 of the cap 26, and maintains airtightness of the manifold 6.

Then, as the result of the elastic pressure contact between the manifold 6 and the cap 26 and due to the support mechanism 38, the wafers 2 which are at the center of the process tube 4 and which are the object of treatment are accurately positioned and so there is equal coverage by the treatment gas and uniform heat conductance and consequently there is uniform treatment inside the process tube 4.

Figure 4:
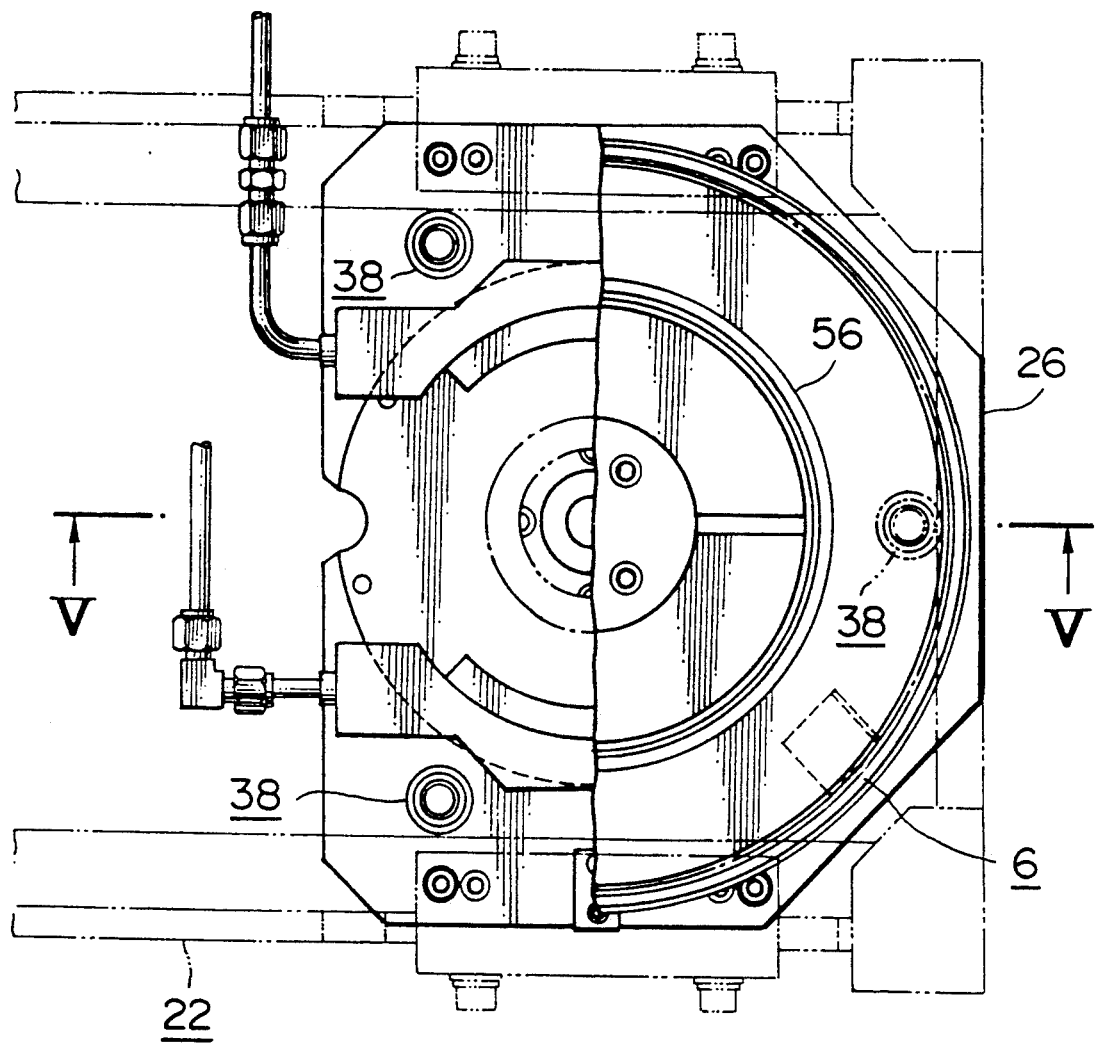
FIG. 4 is a cutout plan view of the left half of another embodiment of the heat treatment apparatus of the present invention.
Figure 5:
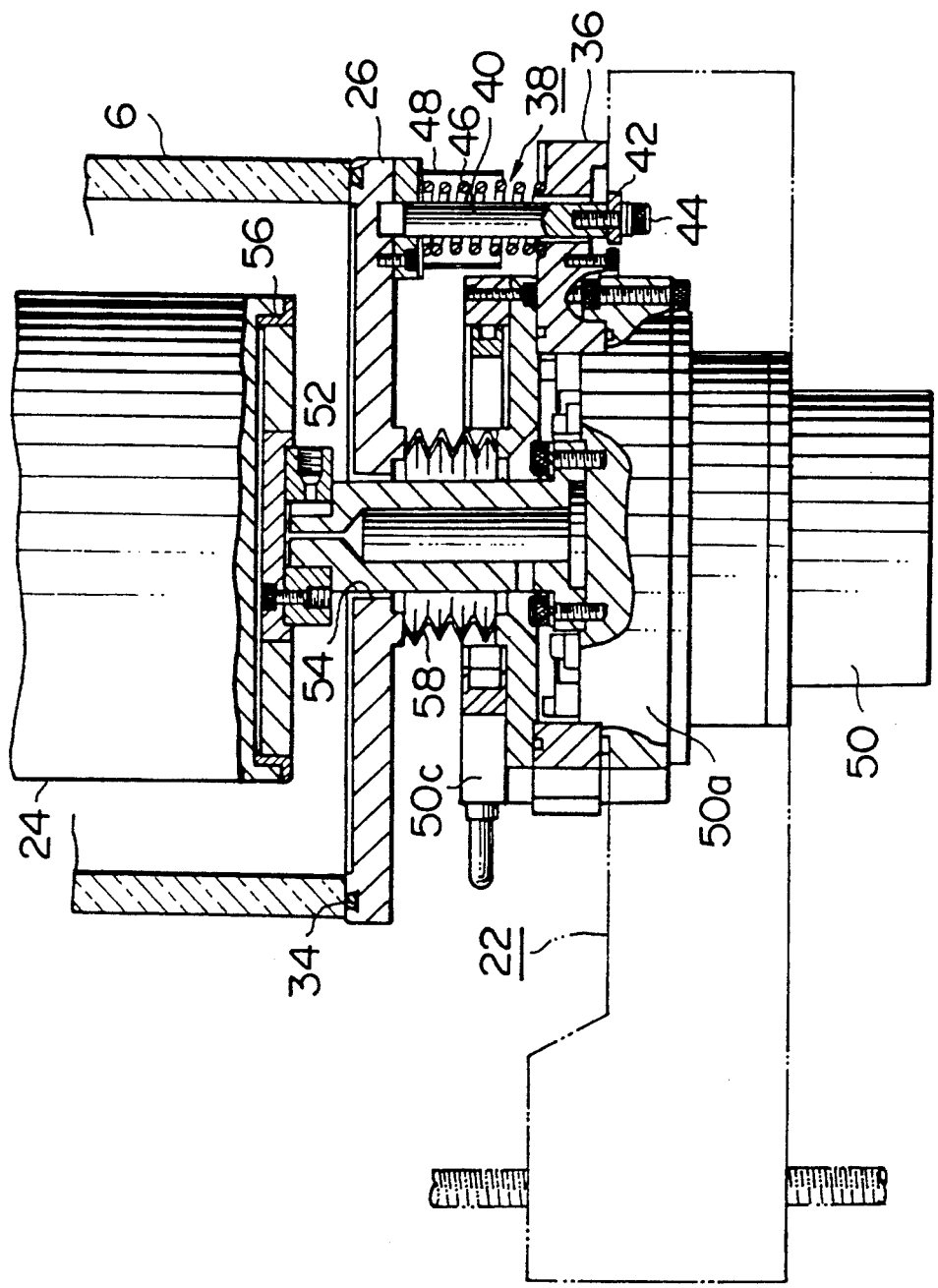
FIG. 5 is a sectional view seen along section line V—V of the heat treatment apparatus shown in FIG. 4, and to which a manifold and a heat retention cylinder have been added.

FIG. 4 and FIG. 5 show other embodiments of the heat treatment apparatus of the present invention. In the embodiments described above, the description has been given for the case where a motor 50 is provided to the side of the lower surface portion of the support frame 36 of the boat elevator 22 but in this embodiment, there is provided a dummy block 50a instead of a motor 50. Even in such a heat treatment apparatus, it is possible to install the support mechanism 38 in the same manner and to elastically maintain a status of close contact between the cap 26 and the manifold 6. In addition, the through hole 54 of the cap 26 is sealed by the bellows and airtightness of the through hole 54 is maintained. Accordingly, this embodiment also has the same action and effect as in the case of the former embodiments.

According to the present invention as has been described above, it is possible to obtain the following effects.

(a). It is possible to elastically close the manifold provided to the side of the opening portion of the process tube, using the cap elastically supported by the support mechanism and for the cap to be elastically held in close contact with respect to the manifold. In addition, there are no trouble such as damage to the manifold due to impact forces or vibration to the side of the manifold accompanying the sealing of the opening portion, and in addition, it is possible to maintain a state of stable airtightness, to prevent destruction and to realize treatment which is reliable.

(b). Even in cases where the horizontality of the cap and the verticality of the wafer boat are not both established, it is possible for the cap to be in elastic and close contact with the manifold. In this case, there is no loss of verticality of the objects for treatment and so the objects for treatment and which are mounted on the upper portion of the cap are not housed in the process tube in an inclined status, it is possible to prevent the lowering of the uniformity of heating and eccentricities of the degree of recirculation of the treating gas with respect to the objects for treatment, for the uniformity of processing to be heightened, and to prevent the lowering of the fault ratio of the objects for treatment.

What is claimed is:

1. A vertical type of heat treatment apparatus which houses objects for treatment in a process tube and performs heat treatment, said vertical type of heat treatment apparatus comprising:
    a cap which opens and closes an opening portion of a manifold and which is disposed on the side of an opening portion of said process tube;
    a support mechanism which elastically supports said cap and which is provided to a vertical motion mechanism of said wafer boat; and
    an expandable and contractible airtightness maintenance means which maintains airtightness on the side of said cap, and which is provided between said cap and said vertical motion mechanism.

2. The vertical type of heat treatment apparatus of claim 1, wherein said support mechanism includes support shafts housing springs which support positions displaced by a required angle around a circle concentric to said cap.

3. The vertical type of heat treatment apparatus of claim 1, wherein said vertical motion mechanism comprises a boat elevator.

4. The vertical type of heat treatment apparatus of claim 1, wherein said airtightness maintenance means comprises a bellows.

5. The vertical type of heat treatment apparatus of claim 1, wherein a water cooled jacket is provided around a periphery of said airtightness maintenance means.

6. The vertical type of heat treatment apparatus of claim 1, wherein said object to be treated is a semiconductor wafer.

* * * * *